(12) United States Patent
Chou et al.

(10) Patent No.: US 12,293,976 B2
(45) Date of Patent: May 6, 2025

(54) SEMICONDUCTOR EMI SHIELDING COMPONENT, SEMICONDUCTOR PACKAGE STRUCTURE AND MANUFACTURING METHOD THEREOF

(71) Applicant: Phoenix Pioneer Technology Co., Ltd., Hsinchu County (TW)

(72) Inventors: E-Tung Chou, Hsinchu County (TW); Po-Han Chiu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 554 days.

(21) Appl. No.: 17/858,286

(22) Filed: Jul. 6, 2022

(65) Prior Publication Data

US 2023/0048468 A1  Feb. 16, 2023

(30) Foreign Application Priority Data

Aug. 16, 2021  (TW) .................. 110130084

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/563* (2013.01); *H01L 23/49838* (2013.01); *H01L 25/165* (2013.01); *H01L 23/49816* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48225* (2013.01); *H01L 2224/73265* (2013.01); *H01L 2924/182* (2013.01); *H01L 2924/3025* (2013.01)

(58) Field of Classification Search
CPC ........ H01L 23/552; H01L 23/58; H01L 23/60
See application file for complete search history.

(56) References Cited

U.S. PATENT DOCUMENTS

| | | | | |
|---|---|---|---|---|
| 5,256,590 A | * | 10/1993 | Inoue | H01L 23/552 |
| | | | | 257/E23.114 |
| 2003/0090883 A1 | * | 5/2003 | Asahi | H01L 25/16 |
| | | | | 257/E21.705 |

(Continued)

*Primary Examiner* — Errol V Fernandes

(57) ABSTRACT

The invention discloses a semiconductor package structure including a package carrier, at least one electronic component, a packaging layer, a support component and a shielding layer. The electronic component is disposed on a first surface of the package carrier. The packaging layer is disposed on the first surface and covers the electronic component. The support component is embedded in the packaging layer to surround the electronic component. An end surface of the support component is electrically connected to a build-up circuit and electrically grounded. A patterned metal layer of the shielding layer is electrically connected to the support component. The shielding range of the patterned metal layer covers at least electronic component. A shielding space, which covers the electronic component, is formed by the support component and the shielding layer. In addition, a semiconductor EMI shielding component and a method of making a semiconductor package structure are also disclosed.

19 Claims, 9 Drawing Sheets

(51) Int. Cl.
*H01L 21/56* (2006.01)
*H01L 23/498* (2006.01)
*H01L 25/16* (2023.01)
*H01L 23/00* (2006.01)

(56) References Cited

U.S. PATENT DOCUMENTS

| | | | | |
|---|---|---|---|---|
| 2012/0280366 | A1* | 11/2012 | Kamgaing | H01L 23/552 |
| | | | | 257/E23.114 |
| 2015/0170988 | A1* | 6/2015 | Watanabe | H01L 24/97 |
| | | | | 257/659 |
| 2017/0295643 | A1* | 10/2017 | Suzuki | H01L 23/552 |
| 2022/0359321 | A1* | 11/2022 | Jung | H01L 25/105 |
| 2022/0359418 | A1* | 11/2022 | Jung | H01L 23/5386 |

* cited by examiner

SEMICONDUCTOR EMI SHIELDING COMPONENT, SEMICONDUCTOR PACKAGE STRUCTURE AND MANUFACTURING METHOD THEREOF

CROSS REFERENCE TO RELATED APPLICATIONS

This Non-provisional application claims priority under 35 U.S.C. § 119(a) on Patent Application No. 110130084 filed in Republic of China on Aug. 16, 2021, the entire contents of which are hereby incorporated by reference.

BACKGROUND

1. Technical Field

This invention relates to a package structure and a manufacturing method thereof, in particular, to a semiconductor package structure with an electromagnetic interference shielding function and a manufacturing method thereof.

2. Description of Related Art

Electromagnetic interference (EMI) can propagate as current along current-carrying conductors such as power lines and cables, or through space as electromagnetic waves. Therefore, according to the different coupling paths of electromagnetic interference, electromagnetic interference can be divided into two types: conducted electromagnetic interference and radiated electromagnetic interference. Electromagnetic interference transmitted through current-carrying conductors is called conducted electromagnetic interference, and electromagnetic interference transmitted through space is called radiated electromagnetic interference.

In general, for radiated electromagnetic interference, spatial shielding or isolation is usually adopted as a countermeasure for improvement, which is divided into the use of metal covers or wire bonding to shield electromagnetic interference, which will be described below.

Please refer to FIG. 1, a conventional package structure 10 includes a circuit board 11, a chip 12, and a packaging layer 13. The chip 12 is electrically connected to a surface of the circuit board 11 and covered by the packaging layer 13. The circuit board 11 can be a multi-layer circuit board, which has a plurality of circuit layers 111 stacked to each other and encapsulated in a dielectric layer 112. The stacked circuit layers 111 are electrically connected through conductive through holes or conductive vias, and one of the circuit layers 111 is designed as a grounding layer 111a.

In order to prevent the chip 12 from being affected by radiated electromagnetic interference, the first EMI shielding method uses a metal cover 14 to cover the outside of the package structure 10 to isolate external electromagnetic interference. The metal cover 14 has a top cover 141 and a sidewall 142. The top cover 141 covers the chip 12, and the sidewall 142 is electrically connected to the grounding layer 111a on the side edge of the package structure 10 to ground the metal cover 14, thereby achieving the purpose of the EMI shielding.

Then, refer to FIG. 2, a conventional electronic device 20 includes a circuit board 21, a plurality of chips 22, and a plurality of passive components 23. The chip 22 and the passive components 23 are soldered on the surface of the circuit board 21.

In order to prevent the chip 22 from being affected by radiated electromagnetic interference, the second method of EMI shielding uses wire bonding to cover the chip 22 to isolate external electromagnetic interference. The wire bonding to cover utilizes a plurality of copper wires 24 to span over the chip 22 to form a cover. The two ends of each copper wire 24 are electrically connected to the ground pads of the circuit board 21, and the ground pads are electrically connected to the exposed electrical connection pads of the grounding layer of the circuit board 21 to form a partial or a full EMI shielding.

In the above-mentioned first EMI shielding method, it is necessary to form a single package structure 10 first, and then assemble the metal cover 14 to the respective package structures 10 one by one, so the process procedures are quite complicated. In the above-mentioned second EMI shielding method, it is necessary to perform wire bonding for the partial or full chip that needs the EMI shielding, and it is conceivable that the required process steps will be more complicated.

To solve the above-mentioned technical problems, it is an important subject matter to provide a semiconductor package structure, a semiconductor EMI shielding component, and a manufacturing method of the semiconductor package structure with the EMI shielding function, so that the semiconductor package structure has the function of the EMI shielding and simplify the manufacturing process.

SUMMARY OF THE INVENTION

In view of the foregoing, an object of the present invention is to provide a semiconductor EMI shielding component, a semiconductor package structure, and a manufacturing method thereof, which have the advantages of a simple and convenient manufacturing process.

To achieve the above, the present invention provides a semiconductor package structure, which includes a package carrier, at least one electronic component, a packaging layer, a support component, and a shielding layer. The package carrier has a first surface and a second surface disposed oppositely and includes a build-up circuit and a first dielectric layer covering the build-up circuit. The electronic component is disposed on the first surface of the package carrier and is electrically connected with the build-up circuit. The packaging layer is disposed on the first surface of the package carrier and covers the electronic component. The support component is embedded in the packaging layer and at least surrounds the electronic component. One end surface of the support component is exposed to a surface of the packaging layer, and the other end surface of the support component is electrically connected to the build-up circuit of the package carrier and electrically grounded. The shielding layer is disposed on the packaging layer and the support component and includes a patterned metal layer and a second dielectric layer covering the patterned metal layer. The patterned metal layer is electrically connected to the support component, and the shielding range of the patterned metal layer covers at least the electronic component and the support component. The support component and the shielding layer together form a shielding space covering the electronic component.

In one embodiment, the patterned metal layer is provided with a plurality of through holes penetrating the patterned metal layer.

In one embodiment, the upper surface of the patterned metal layer is exposed to the upper surface of the second dielectric layer.

In one embodiment, the support component includes a plurality of conductive pillars arranged in a fence type, a continuous sidewall in the shape of a wall, or a combination of the conductive pillars and the continuous sidewall.

In one embodiment, the semiconductor package structure further includes a plurality of conductive adhesives so as to combine the support component with the first surface of the package carrier. The conductive adhesive and the build-up circuit are electrically connected to be electrically grounded, wherein there is a gap between the conductive adhesives.

In addition, to achieve the above, the present invention provides a semiconductor EMI shielding component which can be combined with a package carrier. The semiconductor EMI shielding component includes a second dielectric layer, a patterned metal layer, and a support component. The patterned metal layer is embedded in the second dielectric layer. The support component is made of conductive metal, and one end surface of the support component is embedded in the second dielectric layer and combined with the patterned metal layer and is electrically connected, and the other end surface of the support component is exposed and protrudes from the second dielectric layer. The patterned metal layer and the support component form a shielding space together.

Furthermore, to achieve the above, the present invention provides a manufacturing method of a semiconductor package structure, which includes the following steps. Step 1 is to provide a package carrier, which has a first surface, a second surface, a build-up circuit, and a first dielectric layer, wherein the first surface is opposite to the second surface and the first dielectric layer covers the build-up circuit. Step 2 is to dispose at least one electronic component on a first surface of the package carrier and the electronic component is electrically connected to the build-up circuit. Step 3 is to provide a semiconductor EMI shielding component as described above and combine it to the first surface of the package carrier, and at least cover the electronic component, wherein the semiconductor EMI shielding component is electrically connected to the build-up circuit of the package carrier and electrically grounded. Step 4 is to form a packaging layer in a cavity between the first surface of the package carrier and the semiconductor EMI shielding component to cover the electronic component and the support component of the semiconductor EMI shielding component.

In one embodiment, before the step of combining the semiconductor EMI shielding component with the first surface of the package carrier, it further includes forming a plurality of discontinuous conductive adhesives on the first surface of the package carrier to electrically connect to the build-up circuit and electrically grounded and the discontinuous conductive adhesives being provided for the semiconductor EMI shielding component to be bonded to the package carrier with an end surface of the support component, and there are a plurality of gaps between the conductive adhesives as a filling channel for filling the encapsulation material.

Moreover, to achieve the above, the present invention provides another manufacturing method of a semiconductor package structure, which comprises the following steps. Step 1 is to provide a package carrier, which has a first surface, a second surface, a build-up circuit, and a first dielectric layer, wherein the first surface and the second surface are disposed oppositely and the first dielectric layer covers the build-up circuit. Step 2 is to dispose at least one electronic component on the first surface of the package carrier and electrically connect to the build-up circuit. Step 3 is to form a support component and a packaging layer on the first surface of the package carrier, wherein, the support component is electrically connected to the build-up circuit and electrically grounded and surrounds the electronic component and the packaging layer covers the electronic component and the support component. Step 4 is to electroplate a patterned metal layer on the packaging layer by exposure developing method, and the patterned metal layer is electrically connected to the support component, wherein, the shielding range of the patterned metal layer covers at least the electronic component and the support component. Step 5 is to form a second dielectric layer on the packaging layer and the patterned metal layer to cover the patterned metal layer.

In one embodiment, the steps of forming the support component and the packaging layer further include at least the following two steps. First, the packaging layer is formed on the first surface of the package carrier with a photosensitive dielectric material to cover the electronic component. Then, a plurality of openings are formed in the packaging layer by a patterned exposure developing method and the support component is electroplated in each of the openings to surround the electronic component, wherein, the support component is electrically connected to the build-up circuit and electrically grounded.

In one embodiment, the steps of forming the support component and the packaging layer further include at least the following two steps. First, the support component is electroplated on the first surface of the package carrier by the patterned exposure developing method to surround the electronic component, wherein, the support component is electrically connected to the build-up circuit and electrically grounded. Then, a packaging layer is formed on the first surface of the package carrier to cover the electronic component and the support component and expose one end surface of the support component.

In one embodiment, before the step of forming the patterned metal layer, further includes electroplating to form a conductive metal on an end surface of the support component exposed to the packaging layer by an exposure developing method; and forming a first sub-dielectric layer on the packaging layer to cover the conductive metal and expose one end surface of the conductive metal.

In one embodiment, before the step of forming the patterned metal layer, it further includes forming a first sub-dielectric layer on the packaging layer and forming a plurality of openings in the first sub-dielectric layer to correspondingly expose an end surface of the support component, and electroplating to form a conductive metal in the openings to connected to the support component and an end surface of the conductive metal is exposed to a surface of the first sub-dielectric layer.

In one embodiment, the upper surface of the patterned metal layer is exposed on the upper surface of the second dielectric layer by a leveling operation after forming the second dielectric layer.

As mentioned above, the package structure, the semiconductor EMI shielding component, and the manufacturing method of the package structure of the present invention, which utilizes a semiconductor process to manufacture the EMI shielding component. The EMI shielding component can be integrated with the process of the package structure, and the EMI shielding structure is formed simultaneously during packaging, thereby simplifying the process of the package structure with the EMI shielding function.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

In the following description, this invention will be explained with reference to embodiments thereof. However, the description of these embodiments is only for purposes of illustration rather than limitation.

Figure 1:
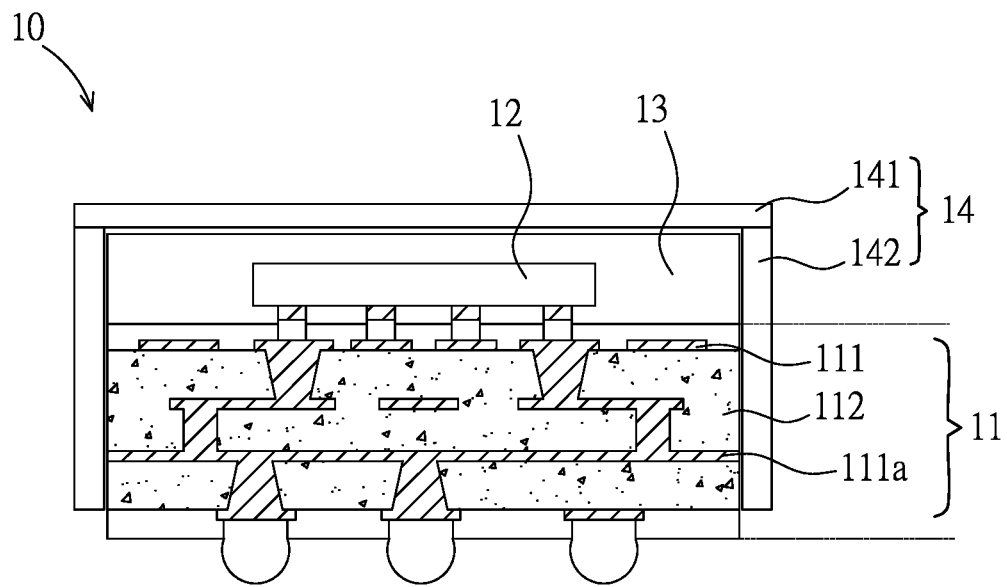
FIG. 1 is showing a schematic structural diagram of a conventional EMI shielding method.
Figure 2:
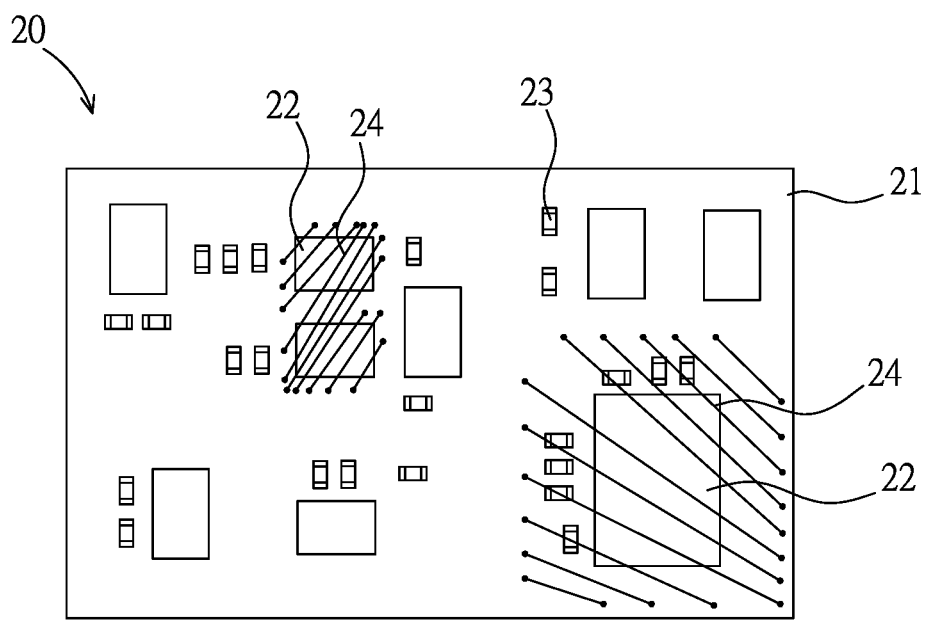
FIG. 2 is showing a schematic structural diagram of another conventional EMI shielding method.
Figure 3:
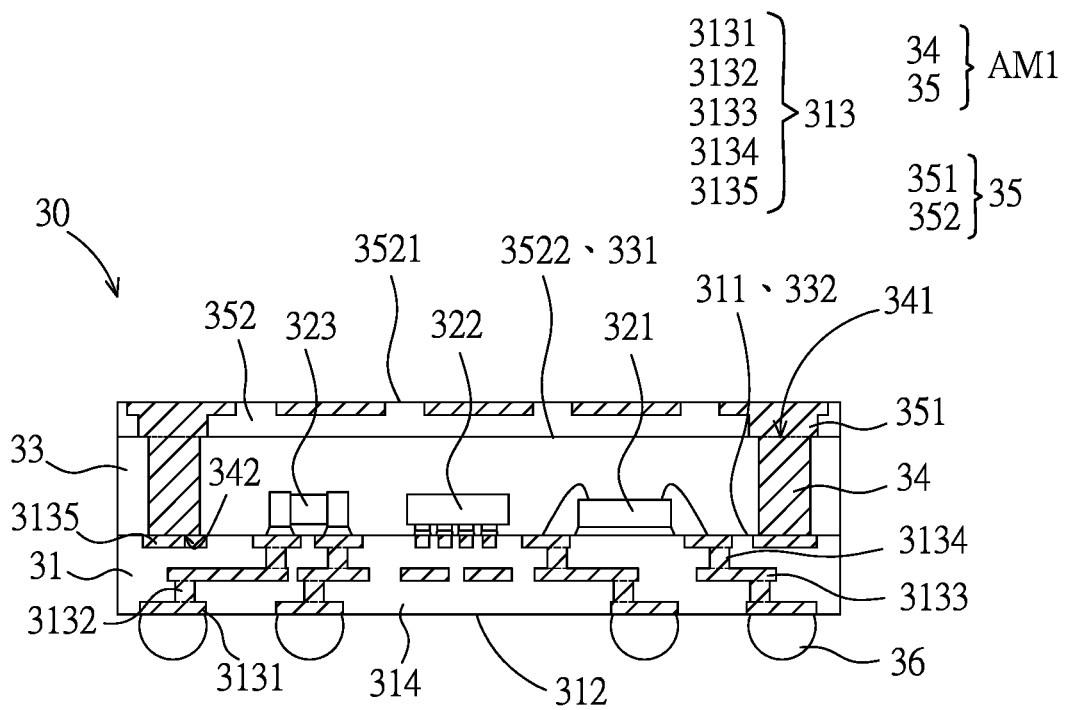
FIG. 3 is showing a schematic cross-sectional view of a package structure according to a preferred embodiment of the invention.

FIG. 3 is a schematic cross-sectional view of a package structure according to a preferred embodiment of the invention. The semiconductor package structure 30 includes a package carrier 31, three electronic components 321-323, a packaging layer 33, a support component 34, a shielding layer 35, and a plurality of solder balls 36.

The package carrier 31 has a first surface 311, a second surface 312, a build-up circuit 313, and a first dielectric layer 314. The first surface 311 and the second surface 312 are disposed opposite to each other. The build-up circuit 313 is embedded in the first dielectric layer 314, and includes a plurality of patterned conductive layers 3131, 3133, 3135 and a plurality of conductive pillar layers 3132, 3134. The patterned conductive layers 3131, 3133, 3135 and the conductive pillar layers 3132, 3134 are made of copper, for example, to form conductive paths. In the embodiment, a portion of the patterned conductive layers 3131 and 3135 can be used as electrical connection pads (or solder pads). For example, a portion of the patterned conductive layer 3131 is electrically connected to the solder balls 36.

The electronic components 321-323 can be respectively disposed on the first surface 311 of the package carrier 31 through the conductive bump or the conductive adhesive other components with conductive bonding capability, and are electrically connected to the build-up circuit 313. In the embodiment, the electronic component 321 is, for example, the chip in a wire bonding package, the electronic component 322 is, for example, the chip in a flip-chip package, and the electronic component 323 is, for example, a capacitor. In other words, the electronic component may be, for example, but not limited to, the active component or the passive component.

The packaging layer 33 has a third surface 331 and a fourth surface 332 opposite to each other. The packaging layer 33 covers the first surface 311 of the package carrier 31 and the electronic components 321-323. In the embodiment, the fourth surface 332 of the packaging layer 33 and the first surface 311 of the package carrier 31 are coplanar.

The support component 34 is made of the conductive metal, and has a first end surface 341 and a second end surface 342 opposite to each other. The support component 34 is embedded within the packaging layer 33 and surrounds the electronic components 321-323. The first end surface 341 of the support component 34 is exposed to the third surface 331 of the packaging layer 33, and the second end surface 342 is electrically connected to the build-up circuit 313 of the package carrier and electrically grounded.

The shielding layer 35 is disposed on the third surface 331 of the packaging layer 33 and the support component 34. The shielding layer 35 includes a patterned metal layer 351 and a second dielectric layer 352. The second dielectric layer 352 covers the patterned metal layer 351 and has a fifth surface 3521 and a sixth surface 3522 opposite to each other. Among them, the sixth surface 3522 and the third surface 331 of the packaging layer 33 are coplanar. Parts of the patterned metal layer 351 are exposed to the fifth surface 3521 and the sixth surface 3522 of the second dielectric layer 352, respectively. The patterned metal layer 351 exposed on the sixth surface 3522 is electrically connected to the first end surface 341 of the support component 34.

Figure 4A:
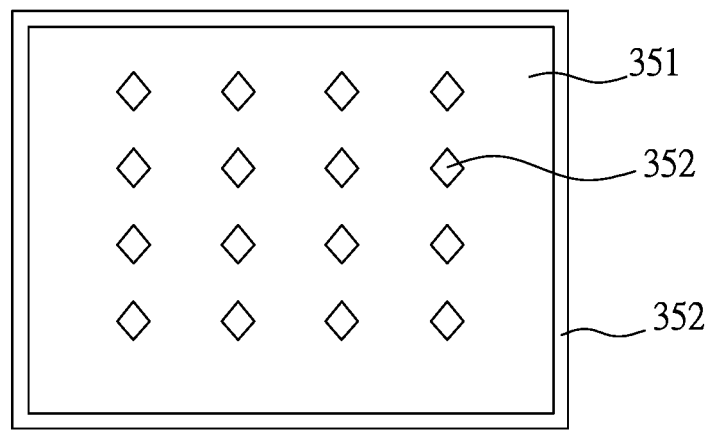
FIG. 4A is showing a schematic top view of the semiconductor EMI shielding component of the package structure according to the preferred embodiment of the invention.

In addition, it is to be noted that the above-mentioned support component 34 and the shielding layer 35 can form a semiconductor EMI shielding component AM1, and the support component 34 and the shielding layer 35 are jointly surrounded to form a shielding space to cover the electronic components 321-323. Please refer to FIGS. 3 and 4A, wherein, FIG. 4A is a schematic top view of the semiconductor EMI shielding component AM1. As shown in FIGS. 3 and 4A, the shielding range of the patterned metal layer 351 covers at least the electronic components 321-323 and the support component 34. As shown in FIG. 4A, a part of the end surface of the patterned metal layer 351 is exposed to the fifth surface 3521 of the second dielectric layer 352, and viewed from the top view, the semiconductor EMI shielding component AM1 can utilize a mesh-like structure to achieve the EMI shielding effect. In other embodiments, the semiconductor EMI shielding component AM1 can also use a complete metal surface or use other patterned metal layer to achieve the EMI shielding effect, which is not limited herein.

Figure 4B:
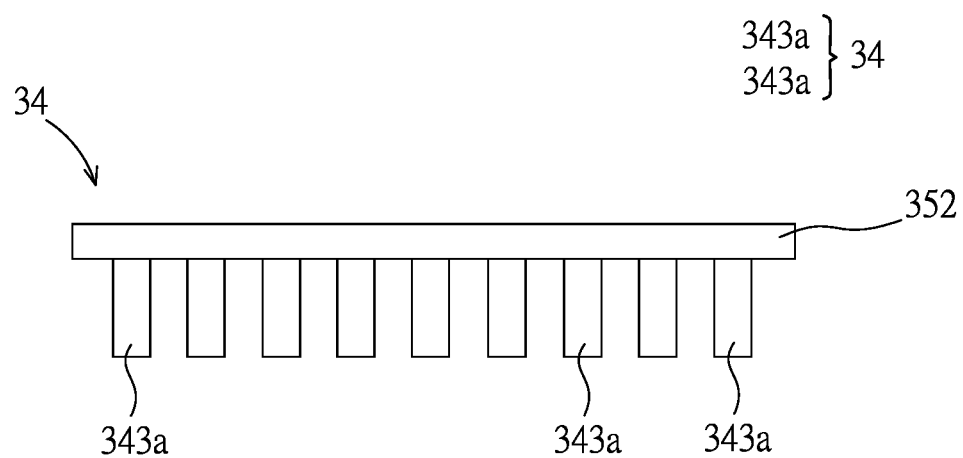
FIG. 4B is showing a schematic side view of the semiconductor EMI shielding component of the package structure according to the preferred embodiment of the invention.

Please refer to FIGS. 3 and 4B, wherein, FIG. 4B is a schematic side view of the semiconductor EMI shielding component AM1. As shown in FIG. 4B, in the embodiment, the support component 34 has a plurality of conductive pillars 343a, which are arranged in a fence type, and each conductive pillar 343a can be connected to the package carrier 31 by the conductive adhesive or solder balls (not shown in the figure).

In addition, the support component 34 of the semiconductor EMI shielding component AM1 can have a variety of changes to expand its application field. The following is a brief description of the variation of the support component 34 of the semiconductor EMI shielding component AM1 with the schematic bottom views of FIGS. 5A to 5D.

Figure 5A:
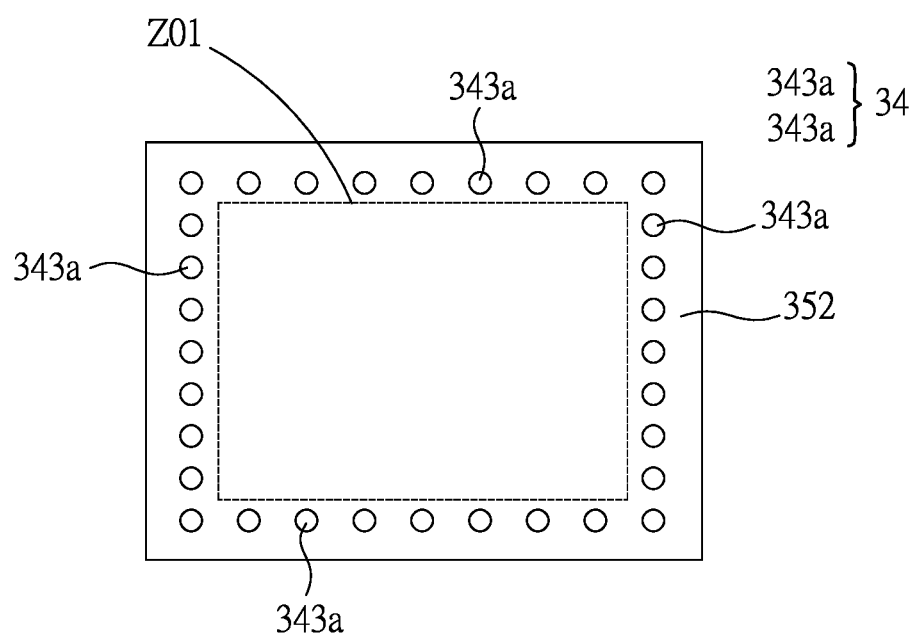
FIGS. 5A to 5D are showing schematic bottom views of the support component of the semiconductor EMI shielding component in different implementations of the package structure according to the preferred embodiment of the invention.
Figure 5B:
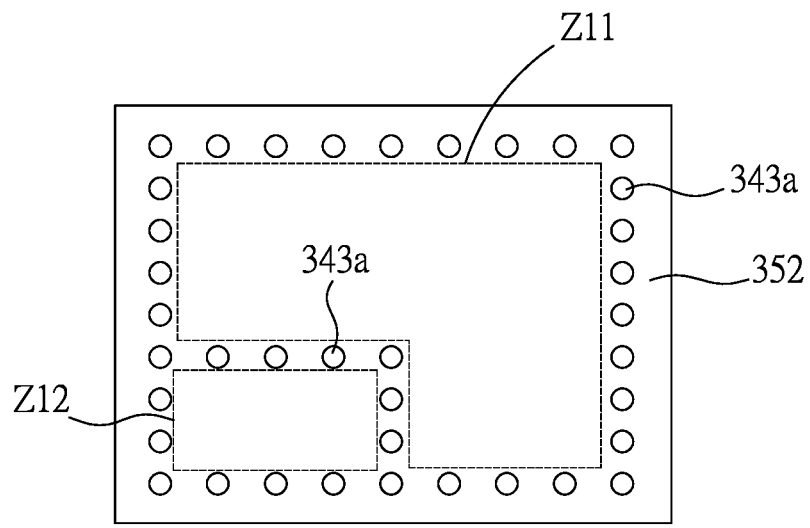

As shown in FIG. 5A, the support component 34 has a plurality of conductive pillars 343a, which are arranged at intervals and form a surrounding area Z01. The aforementioned electronic components 321-323 are located in the surrounding area Z01 and are surrounded by the conductive pillar 343a. As shown in FIG. 5B, a first surrounding area Z11 and a second surrounding area Z12 can be respectively formed by the conductive pillar 343a of the support component 34, which can form the surrounding area with different ranges, so as to prevent local the electronic component performs the EMI shielding, for example, the aforementioned electronic components 321 and 322 are located within the range of the first surrounding area Z11, and the electronic component 323 is located within the range of the second surrounding area Z12. The above description of the surrounding area is only an example, and the shape and size of the surrounding area can be designed according to actual needs.

Figure 5C:
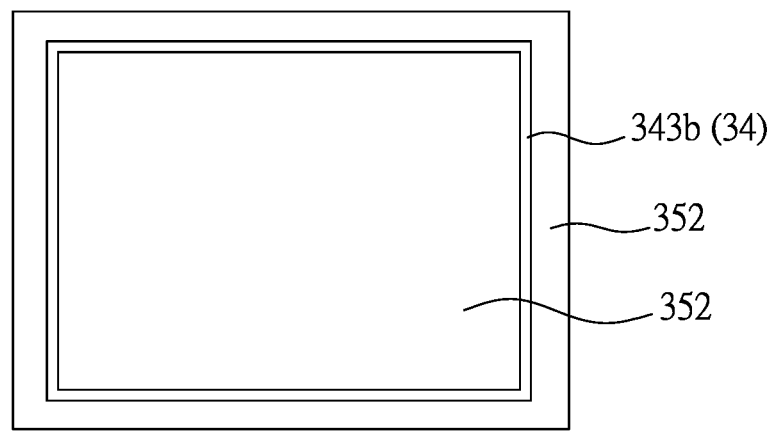
Figure 5D:
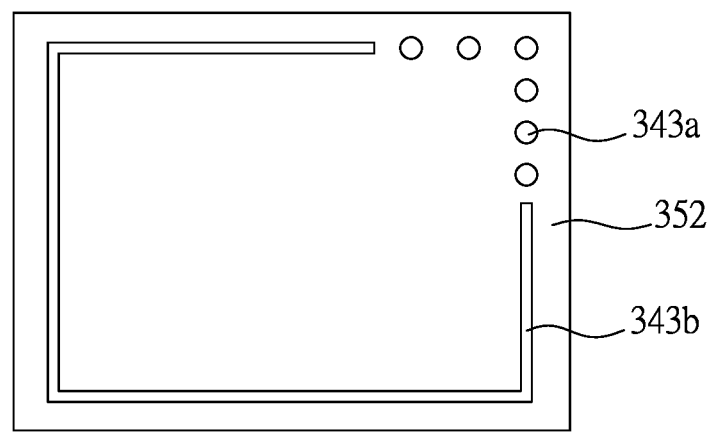

In addition, the support component 34, in addition to the above-mentioned aspect with the conductive pillar, can also be in the form of a continuous sidewall 343b as shown in FIG. 5C, or it is a combination of continuous sidewall 343b and the conductive pillar 343a as shown in FIG. 5D. The implementation of the support component 34 can also be used in combination with the aspects of FIGS. 5A to 5D according to actual requirements, which is not limited herein.

For the above-mentioned package structure with the EMI shielding function, two embodiments will be listed below to illustrate the manufacturing method of the package structure with the EMI shielding function.

Figure 6A:
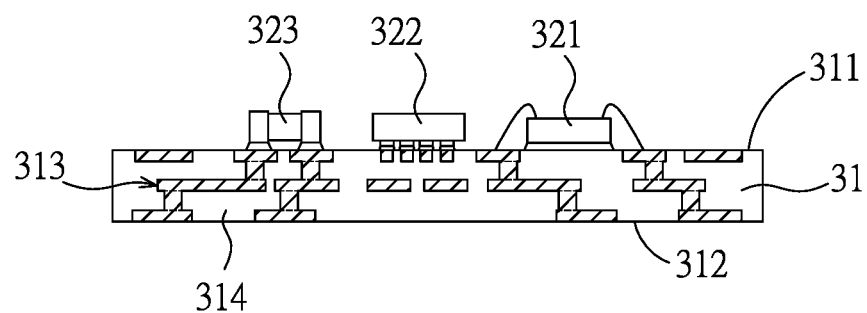
FIGS. 6A to 6C are schematic diagrams showing the manufacturing process of the first package structure according to the preferred embodiment of the invention.
Figure 6B:
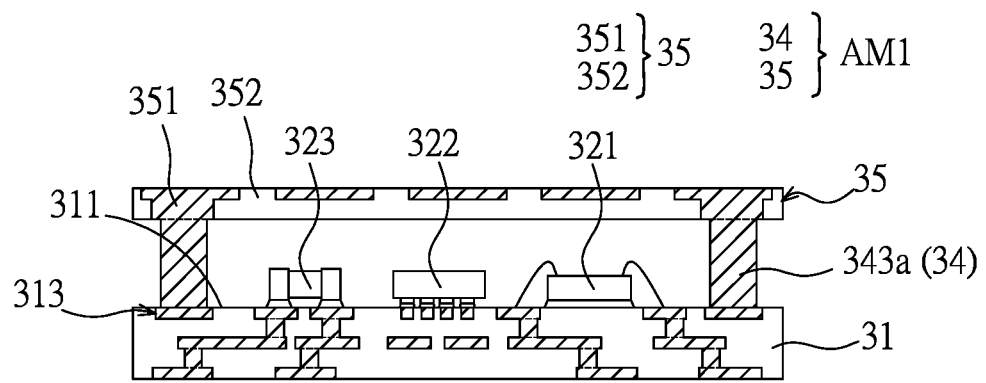
Figure 6C:
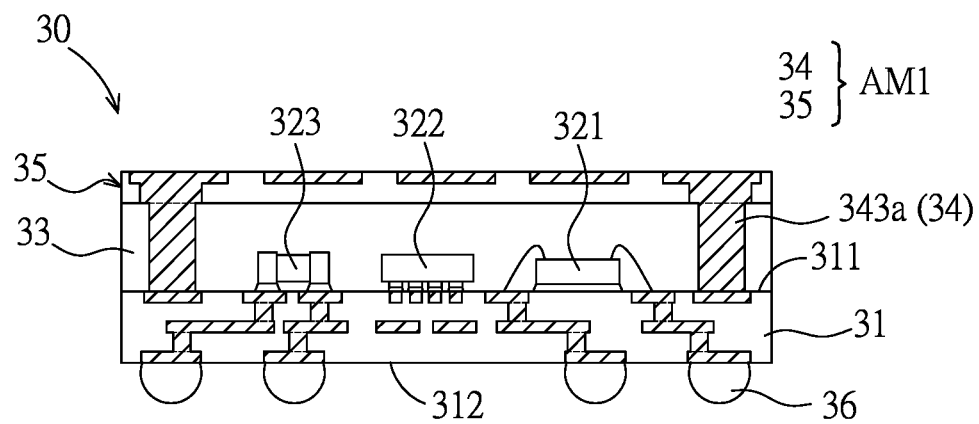

Please refer to FIGS. 6A to 6C, the first embodiment of a manufacturing method of a semiconductor package structure of the present invention includes steps S01-S05.

As shown in FIG. 6A, step S01 is to provide a package carrier 31, which has a first surface 311 and a second surface 312 opposite to each other, and includes a build-up circuit 313 and a first dielectric layer 314 covering the build-up circuit 313.

Step S02 is to dispose three electronic components 321-323 on the first surface 311 of the package carrier 31. The electronic components 321-323 can be disposed on the package carrier 31 by a wire bonding process, a flip chip process, a reflow process, or a conductive adhesive bonding process, and are electrically connected to the build-up circuit 313.

As shown in FIG. 6B, step S03 is to bond a semiconductor EMI shielding component AM1 to the first surface 311 of the package carrier 31 and cover the electronic components 321-323. Among them, the semiconductor EMI shielding component AM1 is electrically connected to the build-up circuit 313 of the package carrier 31 and electrically grounded. In this embodiment, the semiconductor EMI shielding component AM1 has a support component 34 and a shielding layer 35. The support component 34 can include a plurality of conductive pillars 343a arranged in the fence type, which can be arranged or fixed on the first surface 311 of the package carrier 31 through the conductive adhesive, and electrically connected to the build-up circuit 313. The shielding layer 35 includes a patterned metal layer 351 and a second dielectric layer 352, wherein, a part of the patterned metal layer 351 is electrically connected to the conductive pillar 343a.

As shown in FIG. 6C, step S04 is to form a packaging layer 33 in the cavity between the first surface 311 of the package carrier 31 and the semiconductor EMI shielding component AM1 and cover the electronic components 321-323 and the support component 34. In the embodiment, since the support component 34 of the semiconductor EMI shielding component AM1 includes a plurality of the conductive pillars 343a arranged in the fence type, the packaging layer 33 can cover the package carrier 31 and fill between the semiconductor EMI shielding component AM1, the package carrier 31 and the electronic components 321-323 in a fluid state, and then cured.

Step S05 is to form a plurality of solder balls 36 on the second surface 312 of the package carrier 31. In addition, in the embodiment, the package structure formed by the above steps can be completed by a large-format process (or called a panel-level process), and after the cut-single process, a single package structure with the EMI shielding function can be formed.

It should be noted that, when the support component 34 of the semiconductor EMI shielding component AM1 is the continuous sidewall type, the conductive adhesive can be spaced between the bottom end of the sidewall and the first surface of the package carrier 31, and the packaging layer 33 in a fluid state can be filled between the semiconductor EMI shielding component AM1, the package carrier 31, and the electronic components 321-323 through the conductive adhesive disposed at intervals.

Referring to FIGS. 7A to 7F, the second embodiment of a manufacturing method of a semiconductor package structure of the invention includes steps S11 to S22.

Similar to FIG. 6A of the aforementioned embodiment, step S11 is to provide the package carrier 31. Step S12 is to dispose three electronic components 321-323 on a surface of the package carrier 31.

Figure 7A:
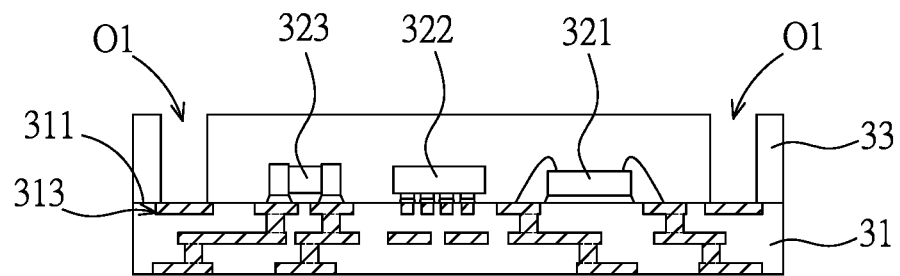
FIGS. 7A to 7F are schematic diagrams showing the manufacturing process of the second package structure according to the preferred embodiment of the invention.

As shown in FIG. 7A, in step S13, a photosensitive dielectric material is used to form a packaging layer 33 on the first surface 311 of the package carrier 31 and cover the electronic components 321, 322, and 323. Step S14 is to form a plurality of first openings O1 in the packaging layer 33 by a patterned exposure developing method to expose part of the first surface 311 and/or the build-up circuit 313 of the package carrier 31. In the embodiment, the first openings O1 are arranged in a fence type to surround the electronic components 321, 322, and 323 and expose a portion of the build-up circuit 313.

Figure 7B:
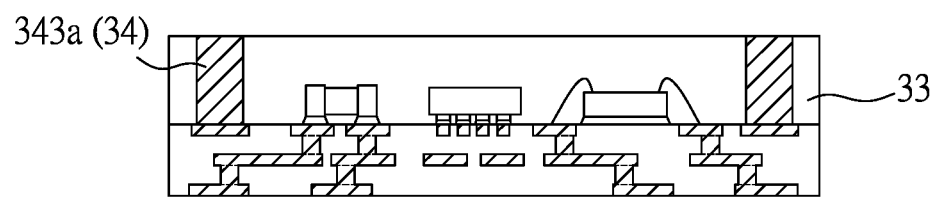

As shown in FIG. 7B, in step S15, a conductive pillar 343a is formed by electroplating in each first opening O1, so that the conductive pillars 343a constitute the aforementioned support component 34.

Here, it is to be noted that in other embodiments, the above-mentioned steps S13, S14, and S15 can be replaced as follows. First, the conductive pillar 343a (the support component 34) is formed on the first surface 311 of the package carrier 31 by patterned exposure developing method and electroplating to surround the electronic components 321, 322, and 323. Next, a packaging layer 33 is formed on the first surface 311 of the package carrier 31 to cover the support component 34 and the electronic components 321, 322, and 323 and expose one end surface of the support component 34. Wherein, the support component 34 is electrically connected to the build-up circuit 313 and electrically grounded. It should be noted that in this example, it is not necessary to select the photosensitive dielectric material as the material of the packaging layer 33, so there are more encapsulation materials to choose from.

Figure 7C:
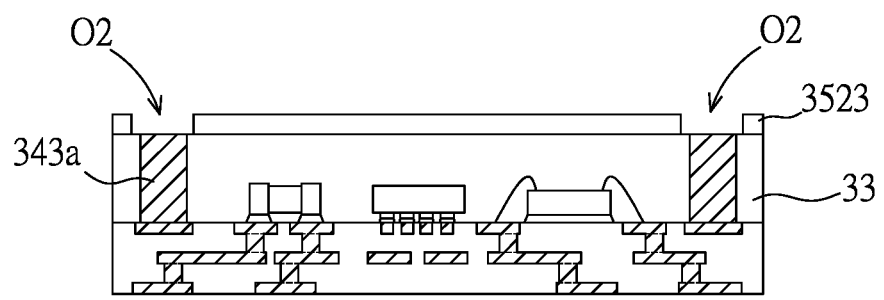

Returning to the present embodiment, as shown in FIG. 7C, step S16 is to form a first sub-dielectric layer 3523 on the packaging layer 33 and the conductive pillar 343a to cover the packaging layer 33. Step S17 is to form a plurality of first sub-openings O2 on the first sub-dielectric layer 3523 to expose an upper end surface of each conductive pillar 343a.

Figure 7D:
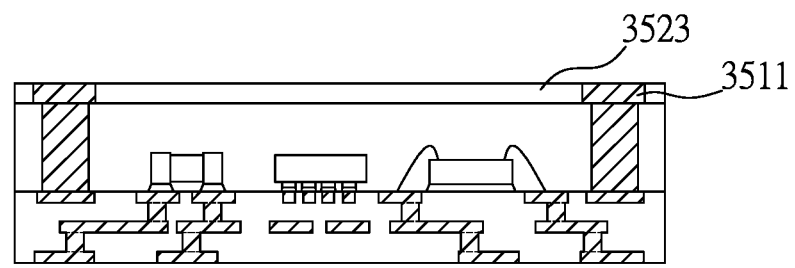

As shown in FIG. 7D, step S18 is to form a first sub-conductive metal 3511 in the first sub-openings O2 and electrically connect the conductive pillars 343a.

Figure 7E:
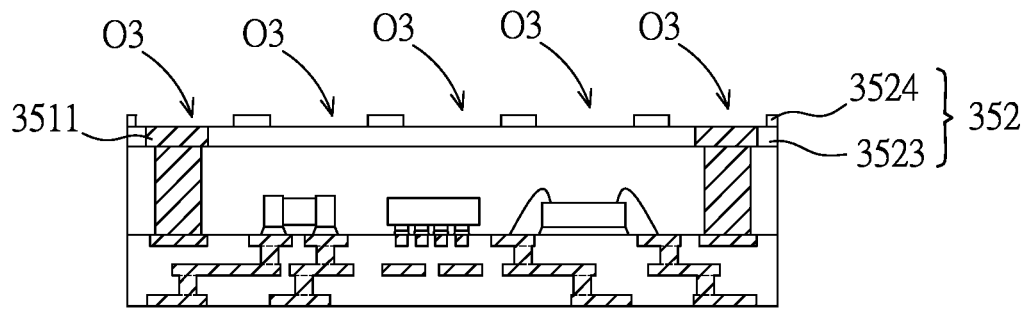

As shown in FIG. 7E, step S19 is to form a second sub-dielectric layer 3524 on the first sub-dielectric layer 3523 and the first sub-conductive metal 3511 to cover the first sub-dielectric layer 3523. The first sub-dielectric layer 3523 and the second sub-dielectric layer 3524 together form the second dielectric layer 352. Step S20 is to form a plurality of second sub-openings O3 to expose part of the first sub-conductive metal 3511 and part of the first sub-dielectric layer 3523.

Figure 7F:
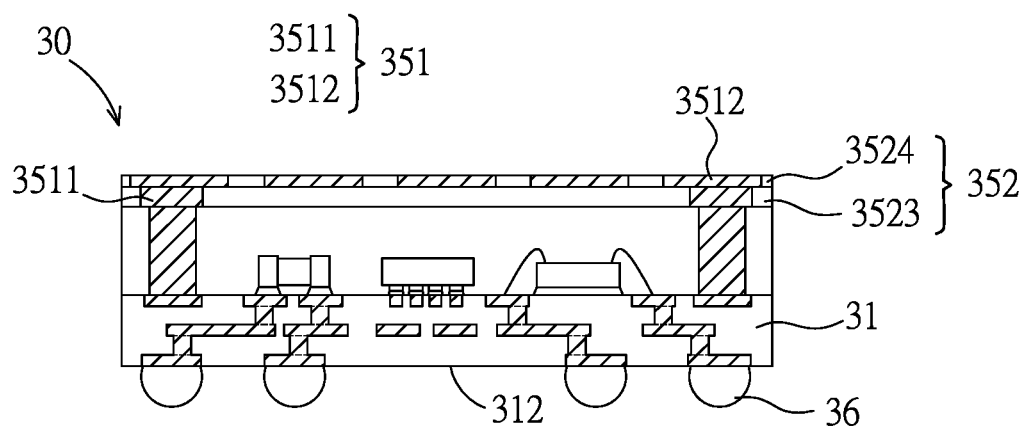

As shown in FIG. 7F, step S21 is to form a second sub-conductive metal 3512 in the second sub-openings O3 so that the first sub-conductive metal 3511 and the second sub-conductive metal 3512 form the patterned metal layer 351. Finally, step S22 is to form a plurality of solder balls 36 on the second surface 312 of the package carrier 31.

Similar to the first manufacturing method of the foregoing embodiment, the semiconductor package structure formed in the above steps S11-S22 can be completed by the large-format process (or called the panel-level process). In addition, a single semiconductor package structure with the EMI shielding function can be formed after the Cut-single process.

In summary, the semiconductor EMI shielding component, the semiconductor package structure, and the manufacturing method thereof disclosed in the present invention utilize the semiconductor process to manufacture the EMI shielding component, which enables the EMI shielding component to be integrated and synchronized with the process of the package structure and simplify the process of the package structure with the EMI shielding function. Compared with the prior art, the present invention has at least the following advantages:

01. The package carrier of the present invention can be combined with the semiconductor EMI shielding component before the cut-single process is performed and the cut-single process is performed after combining.

02. The present invention has the advantages of high workability and short production cycle for the package structure that only needs partial EMI shielding.

03. The EMI shielding component of the present invention is completed by the semiconductor process, it can be completed simultaneously with the package structure, which is also a semiconductor process, using a similar process technology to simplify the process.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A semiconductor package structure, comprising:
a package carrier, which has a first surface, a second surface, a build-up circuit, and a first dielectric layer, wherein, the first surface and the second surface are disposed oppositely and the first dielectric layer covers the build-up circuit;
at least one electronic component, which is disposed on the first surface of the package carrier and is electrically connected to the build-up circuit;
a packaging layer, which is disposed on the first surface of the package carrier and covers the electronic component;
a support component, which is embedded in the packaging layer and at least surrounds the electronic component, one end surface of the support component is exposed to a surface of the packaging layer, and the other end surface of the support component is electrically connected to the build-up circuit of the package carrier and electrically grounded; and
a shielding layer, which is disposed on the packaging layer and the support component and has a patterned metal layer and a second dielectric layer, wherein, the second dielectric layer covers the patterned metal layer, the patterned metal layer is electrically connected to the support component, and the shielding range of the patterned metal layer covers at least the electronic component and the support component;
wherein, the support component and the shielding layer together form a shielding space to surround the electronic component.

2. The semiconductor package structure of claim 1, wherein the patterned metal layer is provided with a plurality of through holes penetrating the patterned metal layer.

3. The semiconductor package structure of claim 1, wherein an end surface of the patterned metal layer is exposed to a surface of the second dielectric layer.

4. The semiconductor package structure of claim 1, wherein the support component comprises a plurality of conductive pillars arranged in a fence type, or a continuous sidewall in the shape of a wall, or a combination of the conductive pillars and the continuous sidewall.

5. The semiconductor package structure of claim 4, further comprising:
a plurality of conductive adhesives, which is disposed between the support component and the first surface of the package carrier to combine the two and electrically connected to the build-up circuit and electrically grounded, wherein there is at least one gap between the conductive adhesives.

6. A semiconductor EMI shielding component, which can be combined with a package carrier, comprising:
a second dielectric layer;
a patterned metal layer, which is embedded in the second dielectric layer; and
a support component, which is made of a conductive metal, one end surface of the support component is embedded in the second dielectric layer and electrically connected to and combined with the patterned metal layer and the other end surface of the support component is exposed and protrudes from the second dielectric layer;
wherein the patterned metal layer and the support component form a shielding space together.

7. The semiconductor EMI shielding component of claim 6, wherein the patterned metal layer is provided with a plurality of through holes penetrating the patterned metal layer.

8. The semiconductor EMI shielding component of claim 6, wherein an end surface of the patterned metal layer is exposed to a surface of the second dielectric layer.

9. The semiconductor EMI shielding component of claim 6, wherein the support component comprises a plurality of conductive pillars arranged in a fence type, or a continuous sidewall in the shape of a wall, or a combination of the conductive pillars and the continuous sidewall.

10. A manufacturing method of a semiconductor package structure, comprising:
   providing a package carrier, which has a first surface, a second surface, a build-up circuit, and a first dielectric layer, wherein the first surface and the second surface are disposed oppositely and the first dielectric layer covers the build-up circuit;
   disposing at least one electronic component on a first surface of the package carrier and electrically connected to the build-up circuit;
   providing a semiconductor EMI shielding component of claim 6, which is combined with the first surface of the package carrier and covers at least the electronic component, wherein the semiconductor EMI shielding component is electrically connected to the build-up circuit of the package carrier and electrically grounded; and
   forming a packaging layer in a cavity between the first surface of the package carrier and the semiconductor EMI shielding component to cover the electronic component and the support component of the semiconductor EMI shielding component.

11. The manufacturing method of claim 10, wherein before the step of combining the semiconductor EMI shielding component with the first surface of the package carrier, further comprising:
   forming a plurality of discontinuous conductive adhesives on the first surface of the package carrier to electrically connect to the build-up circuit and electrically grounded and the discontinuous conductive adhesives being provided for the semiconductor EMI shielding component to be bonded to the package carrier with an end surface of the support component, and there are a plurality of gaps between the conductive adhesives as a filling channel for filling the encapsulation material.

12. A manufacturing method of a semiconductor package structure, comprising:
   providing a package carrier, which has a first surface, a second surface, a build-up circuit, and a first dielectric layer, wherein the first surface and the second surface are disposed oppositely and the first dielectric layer covers the build-up circuit;
   disposing at least one electronic component on a first surface of the package carrier and electrically connected to the build-up circuit;
   forming a support component and a packaging layer on the first surface of the package carrier, wherein the support component is electrically connected to the build-up circuit and electrically grounded and surrounds the electronic component and the packaging layer covers the electronic component and the support component;
   electroplating to form a patterned metal layer on the packaging layer by an exposure developing method, and the patterned metal layer is electrically connected to the support component, wherein a shielding range of the patterned metal layer covers at least the electronic component and the support component; and
   forming a second dielectric layer on the packaging layer and the patterned metal layer to cover the patterned metal layer.

13. The manufacturing method of claim 12, wherein the steps of forming the support component and the packaging layer further comprising:
   forming the packaging layer on the first surface of the package carrier with a photosensitive dielectric material to cover the electronic component; and
   forming a plurality of openings in the packaging layer by a patterned exposure developing method and electroplating to form the support component in each of the openings to surround the electronic component, wherein the support component is electrically connected to the build-up circuit and electrically grounded.

14. The manufacturing method of claim 12, wherein the steps of forming the support component and the packaging layer, further comprising:
   electroplating to form the support component on the first surface of the package carrier by a patterned exposure developing method to surround the electronic component, wherein the support component is electrically connected to the build-up circuit and electrically grounded; and
   forming the packaging layer on the first surface of the package carrier to cover the electronic component and the support component and expose an end surface of the support component.

15. The manufacturing method of claim 12, wherein the support component comprises a plurality of conductive pillars arranged in a fence type, or a continuous sidewall in the shape of a wall, or a combination of the conductive pillars and the continuous sidewall.

16. The manufacturing method of claim 12, wherein before the step of forming the patterned metal layer, further comprising:
   electroplating to form a conductive metal on an end surface of the support component exposed to the packaging layer by an exposure developing method; and
   forming a first sub-dielectric layer on the packaging layer to cover the conductive metal and expose one end surface of the conductive metal.

17. The manufacturing method of claim 12, wherein before the step of forming the patterned metal layer, further comprising:
   forming a first sub-dielectric layer on the packaging layer and forming a plurality of openings in the first sub-dielectric layer to correspondingly expose an end surface of the support component; and
   electroplating to form a conductive metal in the openings to connected to the support component and an end surface of the conductive metal is exposed to a surface of the first sub-dielectric layer.

18. The manufacturing method of claim 12, wherein the patterned metal layer has a plurality of through holes penetrating the patterned metal layer.

19. The manufacturing method of claim 12, further comprising:
   performing a leveling operation after forming the second dielectric layer to expose an upper surface of the patterned metal layer to an upper surface of the second dielectric layer.

* * * * *